(12) United States Patent
Phan Le et al.

(10) Patent No.: US 8,627,726 B2
(45) Date of Patent: Jan. 14, 2014

(54) PRESSURE GAUGE

(75) Inventors: Kim Phan Le, Eindhoven (NL); Jozef T. M. Van Beek, Rosmalen (NL)

(73) Assignee: NXP, B.V., Eindhoven (NL)

( * ) Notice: Subject to any disclaimer, the term of this patent is extended or adjusted under 35 U.S.C. 154(b) by 951 days.

(21) Appl. No.: 12/601,077

(22) PCT Filed: Jun. 4, 2008

(86) PCT No.: PCT/IB2008/052184
§ 371 (c)(1),
(2), (4) Date: Nov. 20, 2009

(87) PCT Pub. No.: WO2008/149298
PCT Pub. Date: Dec. 11, 2008

(65) Prior Publication Data
US 2010/0154553 A1    Jun. 24, 2010

(30) Foreign Application Priority Data

Jun. 4, 2007 (EP) .................................. 07109559

(51) Int. Cl.
*G01L 9/06* (2006.01)

(52) U.S. Cl.
USPC ............................................................ 73/727

(58) Field of Classification Search
USPC ............................................................ 73/727
See application file for complete search history.

(56) References Cited

U.S. PATENT DOCUMENTS

| | | | |
|---|---|---|---|
| 3,732,443 A | | 5/1973 | Lovrenich |
| 3,883,826 A | * | 5/1975 | Kirby ............................ 331/143 |
| 3,927,369 A | | 12/1975 | Billeter et al. |
| 4,023,094 A | | 5/1977 | Adams |
| 4,741,213 A | * | 5/1988 | Hojoh ............................ 73/702 |
| 4,959,999 A | | 10/1990 | Tamura |
| 5,033,306 A | * | 7/1991 | Tamura ......................... 73/755 |

(Continued)

FOREIGN PATENT DOCUMENTS

| | | |
|---|---|---|
| EP | 330385 A2 | 8/1989 |
| GB | 2430752 A | 4/2007 |

(Continued)

OTHER PUBLICATIONS

Petersen, Kurt, et al; "Resonant Beam Pressure Sensor Fabricated With Silicon Fusion Bonding"; 1991 Intl Conference on Solid-State Sensors and Actuators; Digest of Technical Papers; Transducers '91' 1991; pp. 664-667.

(Continued)

*Primary Examiner* — Lisa Caputo
*Assistant Examiner* — Octavia Davis-Hollington

(57) ABSTRACT

A pressure/vacuum sensor and method, comprising: driving a MEMS piezoresistive resonator (8) into resonant vibration, applying Joule heating to the resonator (8); and sensing a variable parameter that varies in response to the tendency of the resonant frequency (fo) to depend upon the temperature of the resonator (8), the temperature thereof depending upon the pressure. The variable parameter may be the resonant frequency of the resonator (8), or a change therein, or may be derived from a feedback loop, being for example a time integrated feedback signal (82) or a reading (94) of the sense current (22), the loop keeping the resonant frequency constant in opposition to the above mentioned tendency. A reference MEMS capacitive resonator (62) may be located in the vicinity of the resonator (8) for compensating purposes.

24 Claims, 9 Drawing Sheets

(56) References Cited

U.S. PATENT DOCUMENTS

| | | |
|---|---|---|
| 6,389,898 B1 * | 5/2002 | Seidel et al. ............... 73/514.29 |
| 7,029,829 B2 | 4/2006 | Stark et al. |
| 7,211,926 B2 * | 5/2007 | Quevy et al. ................. 310/315 |
| 7,562,557 B2 * | 7/2009 | Bennett et al. .............. 73/24.06 |
| 7,750,745 B2 * | 7/2010 | Van Beek ................ 331/116 M |
| 7,806,586 B2 * | 10/2010 | Melamud et al. ............. 374/117 |
| 7,843,283 B2 * | 11/2010 | Reichenbach et al. ........ 333/186 |
| 7,898,148 B2 * | 3/2011 | Steeneken et al. ............ 310/317 |
| 2005/0195050 A1 | 9/2005 | Lutz et al. |
| 2006/0114541 A1 | 6/2006 | Van Beek |
| 2007/0089513 A1 | 4/2007 | Rosenau et al. |
| 2007/0119258 A1 * | 5/2007 | Yee ................................. 73/649 |
| 2009/0146751 A1 | 6/2009 | Pernia et al. |
| 2011/0215877 A1 | 9/2011 | Koning et al. |
| 2012/0075027 A1 | 3/2012 | van Beek et al. |

FOREIGN PATENT DOCUMENTS

| | | |
|---|---|---|
| WO | 86/07507 A | 12/1986 |
| WO | 2004/053431 A | 6/2004 |
| WO | 2005/025057 | 3/2005 |
| WO | 2005/096495 | 10/2005 |
| WO | 2006/081636 A1 | 10/2006 |
| WO | 2010/029490 | 3/2010 |

OTHER PUBLICATIONS

International Search Report for Publication PCT WO 2008/149298 A1.

Nguyen, C., et al. "Micromechanical Resonators for Oscillators and Filters", Proc. 1995 IEEE Ultrasonics Symposium, vol. 1, pp. 489-499 (Nov. 1995).

van der Pol, J., et al."A-BCD: An Economic 100V RESURF Silicon-On-Insulator BCD Technology for Consumer and Automotive Applications", Proc. Int. Symp. on Power Semiconductor Devices and Processes (ISPSD), pp. 327-330 (May 2000).

Kaajakari, V., et al. "Square-Extension Mode Single-Crystal Silicon Micromechanical Resonator for Low-Phase-Noise Oscillator Applications", IEEE Electron Device Letter, vol. 25, No. 4, pp. 173-175 (Apr. 2004).

Jha, et al. "Thermal Isolation of Encapsulated MEMS Resonators", J. of Microelectromechanical Systems, vol. 17, No. 1, pp. 175-184 (Feb. 2008).

* cited by examiner

PRESSURE GAUGE

The present invention relates to pressure gauges (also known as pressure sensors). The present invention is particularly suited to, but not limited to, pressure gauges (or sensors) used as vacuum gauges (or sensors).

Pressure gauges (which may also be termed pressure sensors, and hereinafter the terms "gauge" and sensor are each used to mean gauge or sensor), in particular vacuum gauges, are known.

One well known example of a vacuum gauge is the Pirani vacuum gauge. This comprises a heating element that is placed in the environment/gas to be gauged and means to sense the temperature of the heating element. The thermal conductivity from the heating element to the environment, with the environment acting as a heat sink, depends on the gas pressure. The heating element is continuously supplied with a constant Joule heating, which in time reaches equilibrium with the heat loss. The resulting temperature of the element, which depends on the heat loss and thus the pressure, commonly detected by measuring voltage change on the heating element, is used to indicate the pressure.

A typical response curve 2 of a Pirani gauge is shown in FIG. 1, where the horizontal axis 4 is pressure on a logarithmic scale, the vertical axis 6 is signal voltage, and the region 7 is the most sensitive region of the response curve 2.

Known Pirani gauges tend to suffer from the following disadvantages. They tend to suffer from noise such as 1/f noise (where f is frequency in the noise spectrum) and thermal noise. Signal to thermal noise can be improved by increasing the sense current, but then the power consumption also increases. Moreover the 1/f noise cannot be readily reduced using standard modulation techniques since modulation of high frequency is typically not possible in devices using heat transfer in the detection principle.

EP-A-0 330 385 discloses a pressure gauge comprising a temperature-dependent quartz oscillator and separate heating means adjacent to the oscillating means so as to heat the oscillating means.

Quite separate from the field of pressure gauges, Micro Electro-Mechanical System (MEMS) resonators are known. For instance a MEMS piezoresistive resonator is a longitudinal mode resonator whose excitation is induced by electrostatic actuation and sensing of which is performed by sensing the piezoresistive effect of a doped material, typically silicon, forming the resonator. Such a MEMS piezoresistive resonator is described in WO 2004/053431, the contents of which are incorporated herein by reference. The resonant frequency of a MEMS piezoresistive resonator is temperature dependent. Conventionally, in the field of MEMS piezoresistive resonators, such temperature dependence of the resonant frequency is considered to be a disadvantage.

The present inventors have realised it would be desirable to provide a pressure gauge, particularly a vacuum gauge, that alleviates or reduces the above described disadvantages, and which preferably does not require separate heating means and sensing means. Furthermore, and in consideration of a field quite separate from pressure gauges, the present inventors have realised that a feature of MEMS piezoresistive resonators conventionally known as a disadvantage (i.e. the temperature dependence of the resonant frequency) surprisingly may be used to advantageous effect in provision of a new type of pressure gauge.

In a first aspect, the present invention provides a method for pressure sensing, the method comprising: driving a MEMS piezoresistive resonator into resonant vibration; applying Joule heating to the MEMS piezoresistive resonator; and sensing a variable parameter that varies in response to the tendency of the resonant frequency of the MEMS piezoresistive resonator to depend upon the temperature of the MEMS piezoresistive resonator, the temperature of the MEMS piezoresistive resonator depending upon the pressure.

The variable parameter may be the resonant frequency of the MEMS piezoresistive resonator or a change in the resonant frequency of the MEMS piezoresistive resonator.

The variable parameter may be derived from a feedback loop arranged to provide a varying sense current to the MEMS piezoresistive resonator to keep the resonant frequency constant in opposition to the tendency of the resonant frequency of the MEMS piezoresistive resonator to depend upon the temperature of the MEMS piezoresistive resonator, the temperature of the MEMS piezoresistive resonator depending upon the pressure.

The variable parameter may be a feedback signal in the feedback loop that is integrated over time.

The variable parameter may be a component of the sense current being varied to keep the resonant frequency constant in opposition to the tendency of the resonant frequency of the MEMS piezoresistive resonator to depend upon the temperature of the MEMS piezoresistive resonator, the temperature of the MEMS piezoresistive resonator depending upon the pressure.

The method may further comprise driving a reference MEMS capacitive resonator in the vicinity of the MEMS piezoresistive resonator and compensating the sensed variable parameter with an output of the reference MEMS capacitive resonator.

The sense current may be varied to keep the resonant frequency of the MEMS piezoresistive resonator the same as the resonant frequency of the reference MEMS capacitive resonator.

The reference MEMS capacitive resonator may be positioned adjacent to the MEMS piezoresistive resonator.

The reference MEMS capacitive resonator may be structurally the same as the MEMS piezoresistive resonator.

The reference MEMS capacitive resonator may be integrated on a same substrate as the MEMS piezoresistive resonator.

The pressure sensed may be that of a vacuum.

The pressure sensed may be that inside a micro-cavity of a MEMS, and the MEMS piezoresistive resonator may be integrated in the micro-cavity.

In a further aspect, the present invention provides a pressure sensor, comprising: a MEMS piezoresistive resonator; and means for determining a variable parameter that varies in response to the tendency of the resonant frequency of the MEMS piezoresistive resonator to depend upon the temperature of the MEMS piezoresistive resonator, the temperature of the MEMS piezoresistive resonator depending upon the pressure.

The means for determining the variable parameter may comprise a frequency counter for measuring the resonant frequency of the MEMS piezoresistive resonator or a change in the resonant frequency of the MEMS piezoresistive resonator.

The means for determining the variable parameter may comprise a feedback loop arranged to provide a varying sense current to the MEMS piezoresistive resonator to keep the resonant frequency constant in opposition to the tendency of the resonant frequency of the MEMS piezoresistive resonator to depend upon the temperature of the MEMS piezoresistive resonator, the temperature of the MEMS piezoresistive resonator depending upon the pressure.

The variable parameter may be a feedback signal in the feedback loop that is integrated over time.

The variable parameter may be a component of the sense current being varied to keep the resonant frequency constant in opposition to the tendency of the resonant frequency of the MEMS piezoresistive resonator to depend upon the temperature of the MEMS piezoresistive resonator, the temperature of the MEMS piezoresistive resonator depending upon the pressure.

The pressure sensor may further comprise a reference MEMS capacitive resonator located in the vicinity of the MEMS piezoresistive resonator and arranged to compensate the sensed variable parameter with an output of the reference MEMS capacitive resonator.

The sense current may be varied to keep the resonant frequency of the MEMS piezoresistive resonator the same as the resonant frequency of the reference MEMS capacitive resonator.

The reference MEMS capacitive resonator may be positioned adjacent to the MEMS piezoresistive resonator.

The reference MEMS capacitive resonator may be structurally the same as the MEMS piezoresistive resonator.

The reference MEMS capacitive resonator may be integrated on a same substrate as the MEMS piezoresistive resonator.

In a further aspect, the present invention provides a vacuum sensor comprising a pressure sensor according to the above described possibilities.

In a further aspect, the present invention provides a MEMS, comprising: a micro-cavity; and a pressure or vacuum sensor according to any of the above described possibilities; wherein the MEMS piezoresistive resonator of the pressure or vacuum sensor is integrated in the micro-cavity.

The above aspects of the invention tend to provide one or more of the following advantages.

The readings tend not to be influenced by 1/f noise, and are less influenced by thermal noise than is the case for conventional pressure sensors.

A complete pressure gauge, or vacuum gauge, can be integrated on a single chip, thereby providing efficient manufacture, potentially low cost, and compact size.

Less power tends to be used than is the case for conventional Pirani gauges, since the sense current can be lower since there tends to be a higher signal to noise ratio.

Embodiments of the present invention will now be described, by way of example, with reference to the accompanying drawings, in which.

Figure 1:
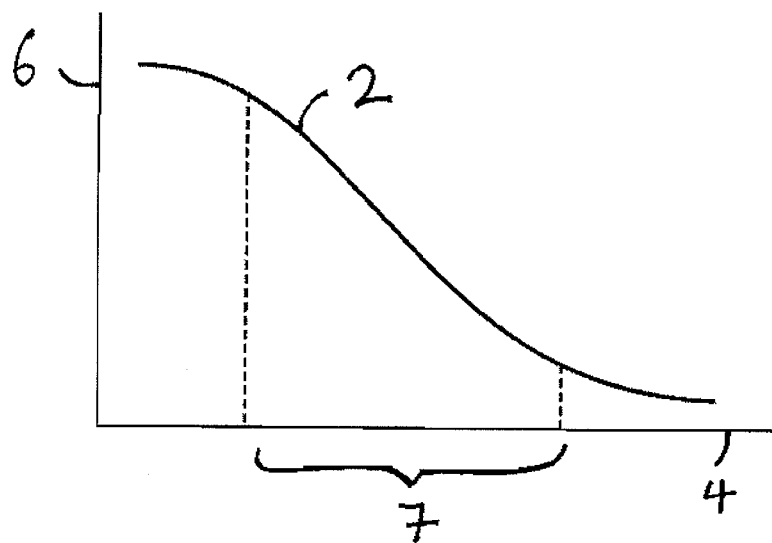
FIG. 1 shows a typical response curve of a Pirani gauge.

We will first describe certain aspects of the principles employed in Pirani gauges that are useful for understanding the embodiments of the present invention that will be described thereafter.

A common construction of a Pirani gauge comprises a heating element which has relatively good thermal isolation with the environment (there must be some air space in between the element and its surrounding) and means to sense the temperature of the heating element. The thermal conductivity k from the heating element to the heat sink (environment) depends on the gas pressure p and can be written as:

$$k(p) = k_{solid} + k_{gas}(\infty)\left(\frac{p/p_0}{1 + p/p_0}\right) \quad (1)$$

in which $k_{solid}$ is the thermal conductivity of the solid parts of the heating element, for instance parts for fixing the heating element to the device frame or the electrical connections, and $k_{solid}$ does not depend on pressure; $k_{gas}(\infty)$ is the thermal conductivity of gas at very high pressure and $p_0$ is an empirical transition pressure at which the thermal conductivity is no longer sensitive to pressure. The heating element is continuously supplied with Joule heating $Q_{joule}$:

$$Q_{joule} = RI^2 t = R_0(1+\alpha\Delta T)I^2 t; \quad (2)$$

and in the same time continuously losing heat ($Q_{loss}$) to the environment:

$$Q_{loss} = \frac{\Delta T k(p) A t}{d} \quad (3)$$

in which $R_0$ is the resistance at room temperature, $\Delta T$ is the difference between temperature of the element and room temperature, $\alpha$ is the thermal coefficient of resistivity, d is the distance between the heating element and the heat sink, A is the surface area of the element that faces the heat sink, and t is time.

The temperature raise $\Delta T$ is related to the total thermal energy by:

$$Q_{joule} - Q_{loss} = C\Delta T \quad (4)$$

in which C is the heat capacity of the element.

Solving the above equations for $\Delta T$ and considering the equilibrium state, in which $t=\infty$ we have the dependence of element temperature on pressure:

$$\lim_{t\to\infty} \Delta T = \frac{R_0 I^2}{\left[k_{solid} + k_{gas}(\infty)\left(\frac{p/p_0}{1+p/p_0}\right)\right]\frac{A}{d} - \alpha R_0 I^2} \quad (5)$$

In Pirani gauges, the temperature difference $\Delta T$ is used as an indication of pressure. Commonly $\Delta T$ is detected by measuring the voltage change on the heating element (which is linearly dependent on $\Delta T$) when a constant current is supplied to the element. An inversed S-shaped curve, shown in FIG. 1, is typically observed when signal is plotted versus pressure in the logarithmic scale, which fits well to equation (5).

Figure 2:
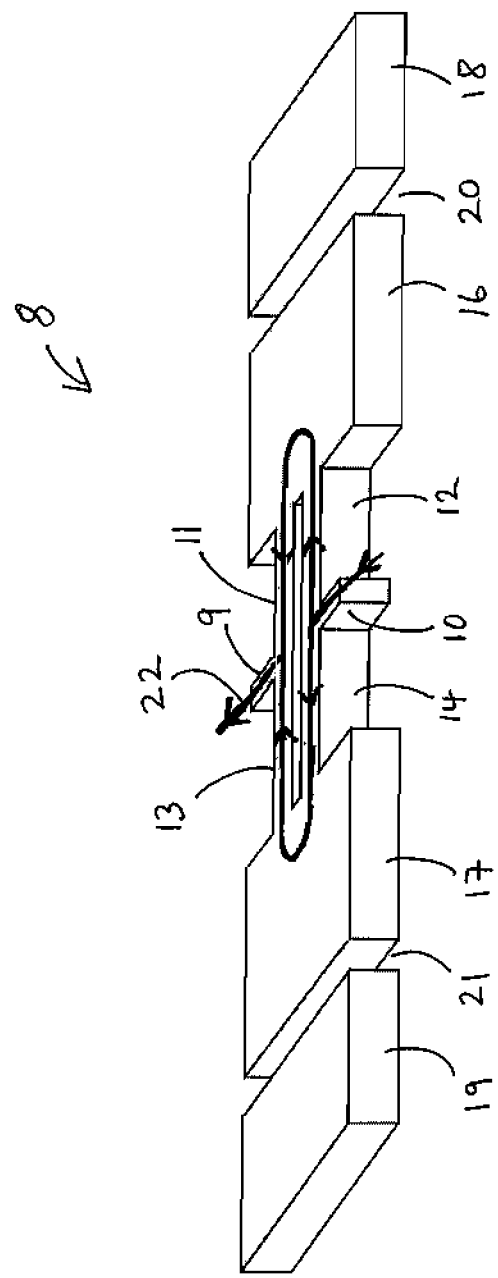
FIG. 2 is a schematic three-dimensional illustration (not to scale) of a MEMS piezoresistive resonator.

FIG. 2 is a schematic three-dimensional illustration (not to scale) of a MEMS piezoresistive resonator 8 which is used in embodiments of a pressure gauge. The MEMS piezoresistive resonator 8 is a longitudinal mode silicon resonator. The MEMS piezoresistive resonator 8 is made from doped silicon. In this embodiment, the MEMS piezoresistive resonator 8 comprises a first anchor 9 and a second anchor 10. The anchors 9, 10 connect the otherwise free-standing structure of the MEMS piezoresistive resonator 8 to a substrate (not shown). The MEMS piezoresistive resonator 8 further comprises four beams (also known as springs), namely a first beam 11, a second beam 12, a third beam 13 and a fourth beam 14. The MEMS piezoresistive resonator 8 further comprises two heads (also known as resonator masses or simply masses), namely a first head 16 and a second head 17. Each beam is attached to, and extends between, one of the anchors and one of the heads, as follows. The first beam 11 is attached to, and extends between, the first anchor 9 and the first head 16. The second beam 12 is attached to, and extends between, the second anchor 10 and the first head 16. The third beam 13 is attached to, and extends between, the first anchor 9 and the second head 17. The fourth beam 14 is attached to, and extends between, the second anchor 10 and the second head 17. In this embodiment, the beams are all straight, or at least substantially straight, and parallel. Moreover, in this embodiment, the first and second beams 11, 12 are symmetrical, or at least substantially symmetrical (relative to the anchors 9, 10) with the third and fourth beams 13, 14.

The MEMS piezoresistive resonator 8 further comprises two actuation electrodes, namely a first electrode 18 and a second electrode 19. The first electrode 18 is positioned at the end of the first head 16 that is furthest from the beams, with a first gap 20 between the first electrode 18 and the end of the first head 16. The second electrode 19 is positioned at the end of the second head 17 that is furthest from the beams, with a second gap 21 between the second electrode 19 and the end of the second head 17.

In operation, excitation of the resonator is induced by electrostatic actuation and sensing is done by piezoresistive effect of the doped silicon beams. In more detail, both an AC voltage and a DC voltage are applied to the electrodes 18, 19, to drive the resonator structure into resonant vibration. A sense current 22 is sent through the beams 11, 12, 13, 14 which form the resonator arms, via the anchors 9, 10, as shown in FIG. 2. Thanks to the piezoresistive effect of doped silicon, the vibration of the beams can be detected by measuring the resistance change of the beams 11, 12, 13, 14. Due to the Joule heating, the beams 11, 12, 13, 14 are slightly hotter than the environment. Since the beams 11, 12, 13, 14 and heads 16, 17 are hung above the substrate, conductive heat loss is minimized. The temperature of the beams 11, 12, 13, 14 depends on the competition between the supply heat by current and heat loss through the anchors 9, 10 and due to gas convection between the resonator and the environment.

Silicon MEMS piezoresistive resonators, such as the above described
MEMS piezoresistive resonator 8, have a property, conventionally viewed as disadvantageous, that their resonant frequency is temperature dependent. However in this invention this property is made use of to provide a pressure gauge, by using the resonant frequency shift as an indicator of the temperature of the beams 11, 12, 13, 14, thus also the gas pressure in the environment around the MEMS piezoresistive resonator 8.

The present inventors have developed the following analysis to lead to a suitable implementation using the above mentioned principles.

The resonant frequency of the longitudinal mode resonator is defined by:

$$f_0 = \sqrt{\frac{w}{16L(Lw+A)}} \sqrt{\frac{E}{\rho}} \quad (6)$$

in which L is the beam length; w is the beam width, A is the area of one of the heads, E is the Young's modulus of the material (here silicon) and $\rho$ is the density of the material (here silicon). The values of L, w, A, E and $\rho$ are all temperature dependent, in which the temperature dependence of E is dominant for silicon:

$$E=E_0(1+\alpha_E\Delta T); L=L_0(1+\alpha_L\Delta T); \rho=\rho_0(1+\alpha_\rho\Delta T); \quad (7)$$

The temperature dependence of the resonant frequency can be approximated as:

$$f_0^2 \approx \frac{w_0}{16(L_0 w_0 + A_0)} \frac{E_0(1-\alpha_E\Delta T)}{\rho_0} \quad (8)$$

Figure 3:
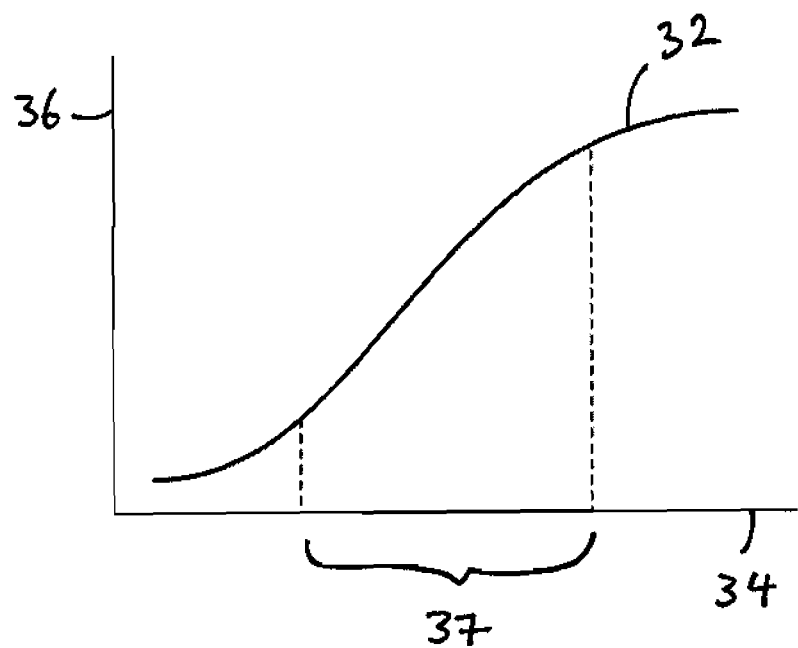
FIG. 3 shows a dependence curve.

Combining equations (8) and (5), the pressure dependence of resonant frequency is obtained. A dependence curve 32 derived by combining equations (5) and (8) is shown in FIG. 3, where the horizontal axis 34 is pressure on a logarithmic scale, the vertical axis 36 is resonant frequency, and the region 37 is the most sensitive region of the dependence curve 32. The dependence curve 32 has an inverse S-shape when pressure is plotted in logarithmic scale as in FIG. 3.

Figure 4:
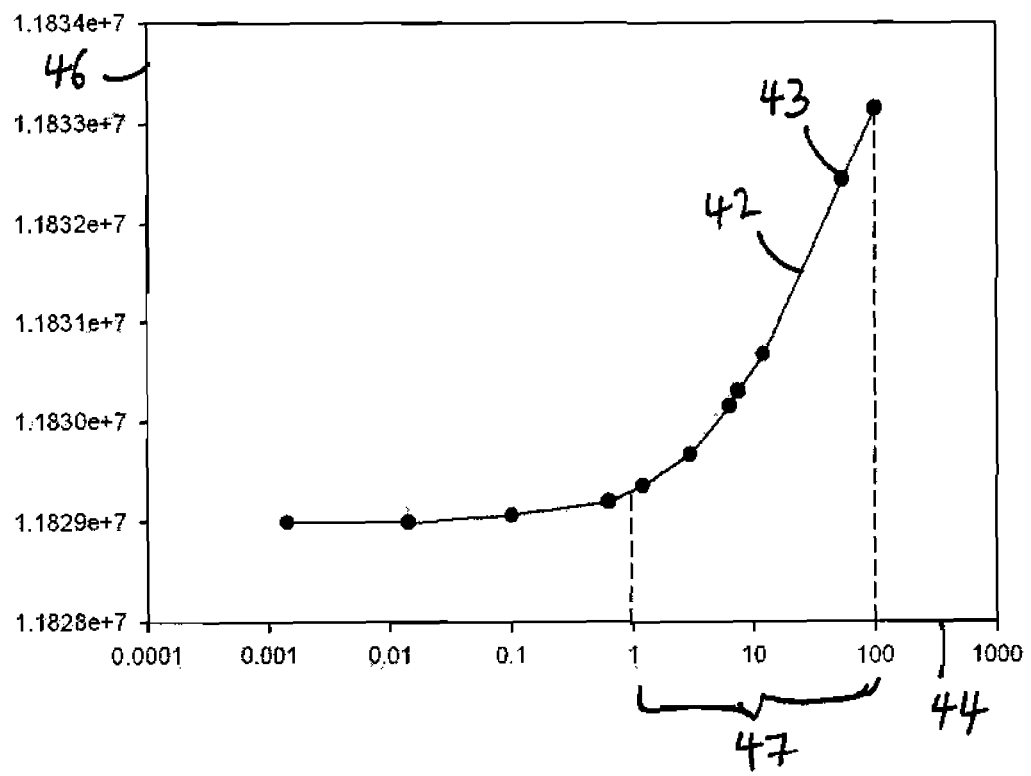
FIG. 4 shows pressure measurements made using a MEMS piezoresistive resonator.

FIG. 4 shows pressure measurements made using a MEMS piezoresistive resonator according to this embodiment, and employing a sense current 22 of 3 mA. (Further details of measuring apparatus are given later below with reference to FIG. 4). More particularly, FIG. 4 shows a measured dependence curve 42 plotted through measured points 43, where the horizontal axis 44 is pressure (in mbar) on a logarithmic scale, the vertical axis 46 is resonant frequency (in Hz), and the region 47 is the most sensitive region of the measured dependence curve 42. The measured dependence curve 42 only extends to a pressure of 100 mbar, however to this extent the measured dependence curve 42 follows the predicted dependence curve 32 and it is expected that were measurements at higher pressures available they would show the region 47 extending to about several hundred mbar, after which the sensitivity response would fall as the S-shaped characteristic then kicked in. Furthermore, even considering only the measurements achieved for FIG. 4, there is a maximum frequency change of approximately 350 ppm (parts per million), which is readily usable in the field of resonator frequency change.

Figure 5:
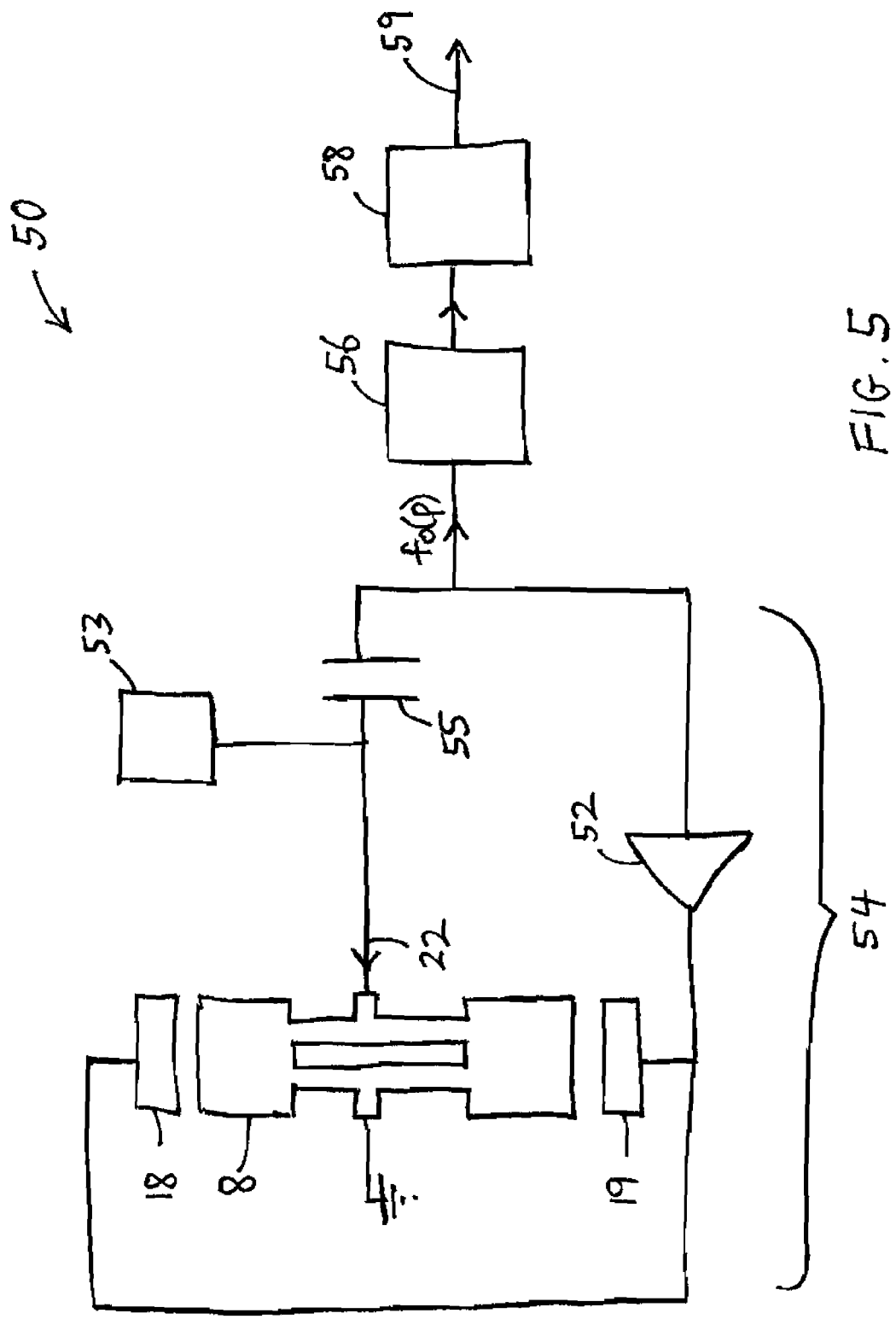
FIG. 5 is a simplified circuit/block diagram showing details of a pressure sensor arrangement.

FIG. 5 is a simplified circuit/block diagram showing further details of a pressure sensor arrangement 50 using the above described MEMS piezoresistive resonator 8. The pressure sensor arrangement 50 comprises the above described MEMS piezoresistive resonator 8 arranged in a feedback loop with an integrated amplifier 52. The MEMS piezoresistive resonator 8 and the integrated amplifier 52 together provide an oscillator circuit 54 whose oscillating frequency $f_0(p)$ varies with pressure as described above. The oscillator circuit 54 further comprises a current source 53 and a capacitor 55. The current source provides the sense current 22 that flows through the beams of the MEMS piezoresistive resonator 8 as described earlier above. The capacitor 55 blocks the sense current 22 from entering the RF signal loop of the oscillator circuit.

The pressure sensor arrangement 50 further comprises a digital frequency counter 56 connected in series with the oscillating circuit 54, and a processor 58 connected in series with the output of the digital frequency counter 56. The digital frequency counter 56 determines a value of the frequency $f_0(p)$ and forwards a representation of this frequency value to the processor 58. The processor 58 is pre-programmed with a frequency/pressure characteristic derived from the various response characteristics described above with reference to FIGS. 3 and 4. The processor 58 processes the digital frequency value in relation to the pre-programmed frequency/pressure characteristic to provide an output 59 representing the determined pressure value.

The output 59 may be fed into further apparatus as required or desired according to the circumstances under consideration. For example, the output 59 may be fed into a display to enable the pressure value to be displayed or otherwise indicated. Alternatively, or in addition, the output 59 may be fed into automatic test equipment or a control apparatus in which the sensed pressure reading is used as a test input parameter or as a control input variable respectively.

Another possibility is that some or all of the processing carried out by the processor 58, or some or all of the processing carried out by the digital frequency counter 56 and the processor 58, may be carried out instead by parts of end-use apparatus such as a display and/or a control apparatus. In these cases, either the oscillating circuit 54 itself or the oscillating circuit 54 in combination with the digital frequency counter 56 represent respectively a pressure sensor element or a pressure sensor.

In the above described embodiment the frequency is counted by the digital frequency counter 56. However, in other embodiments, the frequency may be counted or determined by any other suitable apparatus, for example a phase-lock frequency counter or a heterodyne frequency counter.

The above described embodiments may suffer from a dependency on ambient temperature. Thus in further embodiments, a temperature sensor is included, preferably "on-chip" with the MEMS piezoresistive resonator, and a circuit is provided to include temperature correction based on the output of the temperature sensor. This circuit may be provided as part of the processor 58, or may be a separate module.

The above described embodiments may suffer from variation of resonant frequency of the MEMS piezoresistive resonator 8 from one device to another due to material and/or manufacturing process variations. This can be alleviated by conventional calibration processes.

A further embodiment will now be described which tends to alleviate or remove the effects of the limitations mentioned in the two preceding paragraphs, i.e. ambient-temperature dependency and material/manufacturing variations. The basic approach of the following embodiment may be applied to any of the embodiments, or variations thereof, described above.

Figure 6:
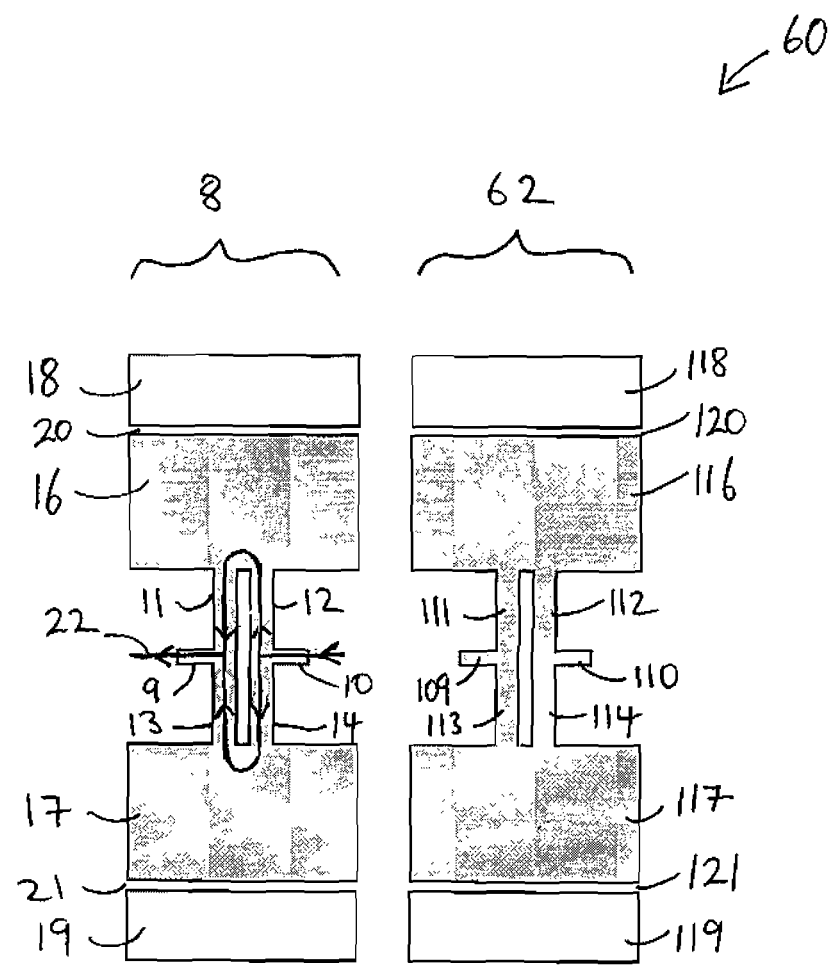
FIG. 6 is a schematic two-dimensional illustration (not to scale) of a MEMS piezoresistive resonator arrangement.

FIG. 6 is a schematic two-dimensional illustration (not to scale) of a MEMS piezoresistive resonator arrangement 60. The MEMS piezoresistive resonator arrangement 60 comprises a MEMS piezoresistive resonator 8 of the same type as that described above in the earlier embodiments (and in FIG. 6 the same reference numerals are used as in FIG. 2 to indicate the same items), and a further integrated MEMS resonator, more particularly a capacitive resonator. The capacitive resonator is formed on the same substrate as the MEMS piezoresistive resonator 8, and preferably positioned alongside the MEMS piezoresistive resonator 8. The capacitive resonator acts as a reference resonator 62.

The reference resonator 62 tends to reduce or remove any ambient temperature dependence and/or device-to-device variation. The reference resonator 62 is manufactured with a similar structure to the MEMS piezoresistive resonator 8, preferably a replica of the MEMS piezoresistive resonator 8. As such, the reference resonator 62 comprises a first anchor 109 and a second anchor 110. The anchors 109, 110 connect the otherwise free-standing structure of the reference resonator 62 to the substrate (not shown), i.e. the same substrate as that of the MEMS piezoresistive resonator 8. The reference resonator 62 further comprises four beams (also known as springs), namely a first beam 111, a second beam 112, a third beam 113 and a fourth beam 114. The reference resonator 62 further comprises two heads (also known as resonator masses or simply masses), namely a first head 116 and a second head 117. Each beam is attached to, and extends between, one of the anchors and one of the heads, as follows. The first beam 111 is attached to, and extends between, the first anchor 109 and the first head 116. The second beam 112 is attached to, and extends between, the second anchor 110 and the first head 116. The third beam 113 is attached to, and extends between, the first anchor 109 and the second head 117. The fourth beam 114 is attached to, and extends between, the second anchor 110 and the second head 117. In this embodiment, the beams are all straight, or at least substantially straight, and parallel. Moreover, in this embodiment, the first and second beams 111, 112 are symmetrical, or at least substantially symmetrical (relative to the anchors 109, 110) with the third and fourth beams 113, 114.

In operation, the MEMS piezoresistive resonator 8 is provided with a sensing current 22 as in the above described embodiments. However, no sensing current is passed along the beams 111, 112, 113, 114 of the reference resonator 62, and instead capacitance change between the electrodes 118, 119 and the resonator mass-beam structure (formed by the beams 111, 112, 113, 114 and the heads 116, 117) is used to sense vibration. As there is no sensing current passing though the beams 111, 112, 113, 114, the beams 111, 112, 113, 114 stay at the ambient temperature. Consequently, the resonant frequency of the reference resonator 62 is almost independent of pressure, and only depends on the ambient temperature. By comparing the resonant frequency of the MEMS piezoresistive resonator 8 being used as the sensing resonator with that of the reference resonator 62, the pressure information can be extracted while the influence of the ambient temperature and manufacturing process variations can be eliminated or at least reduced. The latter reduction arises since the close proximity of the two devices to each other (the MEMS piezoresistive resonator 8 and the reference resonator 62) means dimension variation or inaccuracy should be the same (or at least closer to each other than would otherwise be the case). For reasons of common response, the MEMS piezoresistive resonator 8 and the reference resonator 62 preferably are of the same dimensions as each other.

Figure 7:
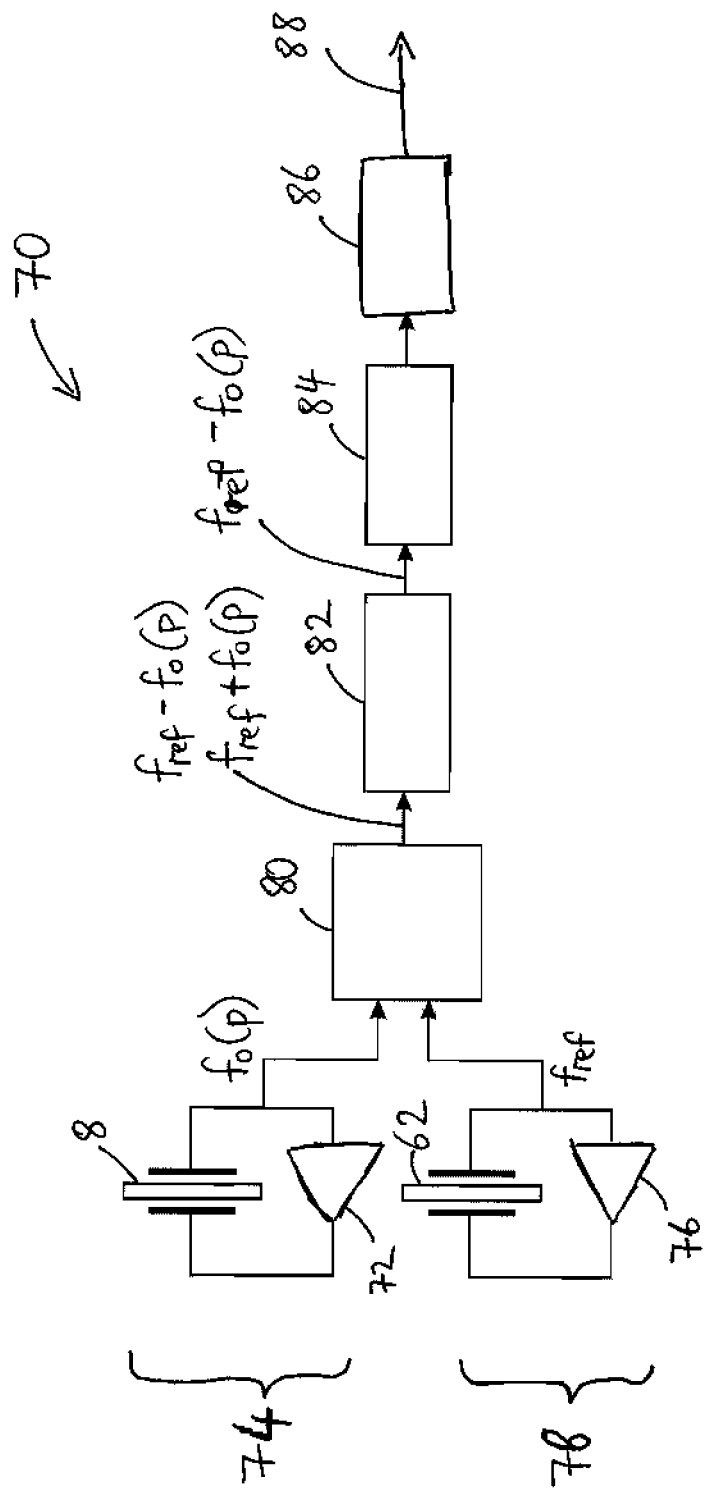
FIG. 7 is a simplified circuit/block diagram showing details of a pressure sensor arrangement.

FIG. 7 is a simplified circuit/block diagram showing further details of a pressure sensor arrangement 70 using the above described combination of MEMS piezoresistive resonator 8 and reference resonator 62. The pressure sensor arrangement 70 comprises the above described MEMS piezoresistive resonator 8 arranged in a feedback loop with an integrated amplifier 72. The MEMS piezoresistive resonator 8 and the integrated amplifier 72 together provide a sensing oscillator circuit 74 whose oscillating frequency $f_0(p)$ varies with pressure as described above. For the sake of clarity of the drawing, the sensing oscillator circuit 74 is shown in a simplified schematic form, with other aspects related to the sensing oscillator circuit 74, such as a current source and a capacitor corresponding to the current source 53 and the capacitor 55 shown in FIG. 5 not being shown in FIG. 7, although such elements are in fact present as required. Furthermore, for the same reason, the connections to/from the MEMS piezoresistive resonator 8 and integrated amplifier 72 are shown in a simplified schematic form rather than in exact detail with respect to the beams and so on.

The pressure sensor arrangement 70 further comprises the above described reference resonator 62 arranged in a feedback loop with an integrated amplifier 76. The reference resonator 62 and the integrated amplifier 76 together provide a reference oscillator circuit 78 whose oscillating frequency $f_{ref}$ does not vary with pressure. Again, for the sake of clarity of the drawing, the reference oscillator circuit 78 is shown in a simplified schematic form, with other aspects related to the reference oscillator circuit 78, such as a current source and a capacitor corresponding to the current source 53 and the capacitor 55 shown in FIG. 5 not being shown in FIG. 7, although such elements are in fact present as required. Furthermore, for the same reason, the connections to/from the reference resonator 62 and integrated amplifier 76 are shown in a simplified schematic form rather than in exact detail with respect to the beams and so on.

The pressure sensor arrangement 70 further comprises a mixer 80. The sensing oscillator circuit 74 and the reference oscillator circuit 78 are arranged such that their output signals, having frequencies $f_{ref}$ and $f_0(p)$, are each fed in to the mixer 80, where the signals are mixed. Because the two resonant frequencies are close to each other, a low frequency component equal to the difference $f_{ref}-f_0(p)$ appears in the output of the mixer, along with a high frequency component equal to $f_{ref}+f_0(p)$.

The pressure sensor arrangement 70 further comprises a high-pass filter 82 connected in series with the output of the mixer 80. The high-pass filter 82 extracts the low frequency component $f_{ref}-f_0(p)$ and provides this as an output.

The pressure sensor arrangement 70 further comprises a digital frequency counter 84 connected in series with the output of the high-pass filter 82, and a processor 86 connected in series with the output of the digital frequency counter 84. The digital frequency counter 84 determines a value of the low frequency component $f_{ref}-f_0(p)$ and forwards a representation of this frequency value to the processor 86. The processor 86 is pre-programmed with a frequency/pressure characteristic derived from the various response characteristics described above with reference to FIGS. 3 and 4, and compensation values derived with respect to the characteristics of the reference resonator 62. The processor 86 processes the digital frequency value in relation to the pre-programmed frequency/pressure/reference characteristics to provide an output 88 representing the determined pressure value.

The output 88 may be fed into further apparatus as required or desired according to the circumstances under consideration. For example, the output 88 may be fed into a display to enable the pressure value to be displayed or otherwise indicated. Alternatively, or in addition, the output 88 may be fed into a control apparatus in which the sensed pressure reading is used as a control input variable.

Another possibility is that some or all of the processing carried out by any one or more of the processor 86, the frequency counter 84, the high-pass filter 82 and the mixer 80, may be carried out instead by parts of end-use apparatus such as a display and/or a control apparatus. In these cases, either the combination of the sensing oscillating circuit 74 and the reference oscillating circuit 78, or the oscillating circuits 74 and 78 in combination with any one or more of the mixer 80, the high-pass filter 82, the frequency counter 84, and the processor 86, whose processing is not carried out by such end-use apparatus, represents a pressure sensor.

In the above described embodiment the frequency is counted by the digital frequency counter 84. However, in other embodiments, the frequency may be counted or determined by any other suitable apparatus, for example a phase-lock frequency counter or a heterodyne frequency counter.

For completeness it is noted that the resonant frequency $f_{ref}$ of the capacitive resonator is slightly dependent on pressure via a different mechanism, which only occurs at high pressure range. This is because the thin air layer in the gaps between the beams acts as an extra spring whose spring constant depends on pressure. However this dependence is very small compared to the piezoresistive case and is anyway effectively totally cancelled out since this mechanism is also present in the MEMS piezoresistive resonator 8.

In the above embodiments, the variation in resonant frequency is sensed and processed to provide the ultimate pressure-related output. In other embodiments, described below with reference to FIGS. 8 and 9, the pressure sensor is arranged to work in a further feedback mode in which the resonant frequency is kept constant by measuring the frequency and using the measured frequency to provide a feedback signal to vary the sense current 22 such as to keep the frequency unchanged. The temperature of the MEMS piezoresistive resonator 8 and hence the pressure of the environment may be determined either from the feedback signal (as in the case of the embodiment described below with reference to FIG. 8) or from the DC component of the sense current 22 (as is the case in the embodiment described below with reference to FIG. 9).

Figure 8:
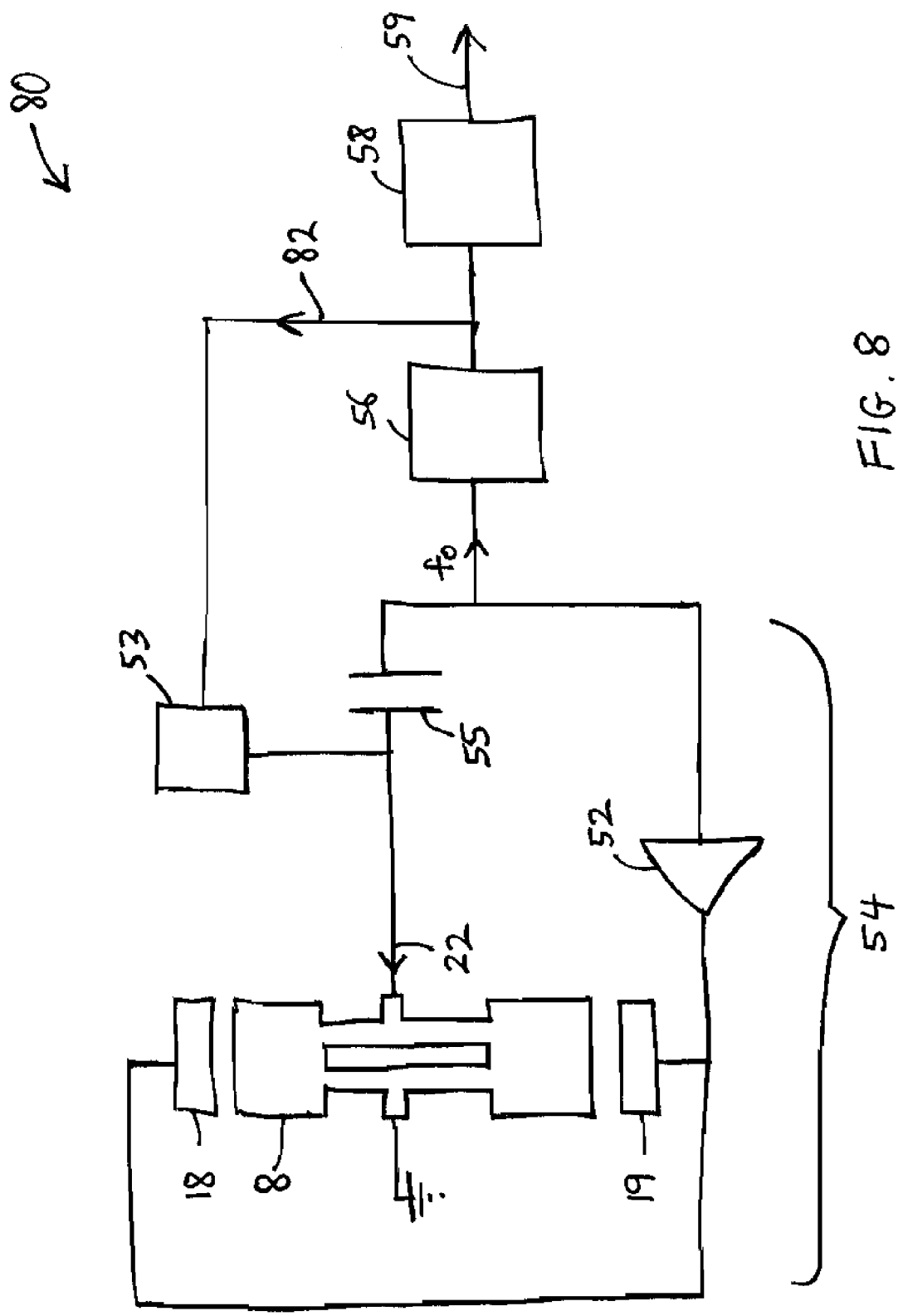
FIG. 8 is a simplified circuit/block diagram showing certain details of a pressure sensor arrangement.

FIG. 8 is a simplified circuit/block diagram showing certain details of a further embodiment of a pressure sensor arrangement 80 using the above described MEMS piezoresistive resonator 8. The pressure sensor arrangement 80 comprises the above described MEMS piezoresistive resonator 8 arranged in a feedback loop with an integrated amplifier 52. The MEMS piezoresistive resonator 8 and the integrated amplifier 52 together provide an oscillator circuit 54 whose oscillating frequency $f_0$ would tend to vary with pressure as described above, but in this embodiment is kept at $f_0$ (or some other fixed value) by a further feedback loop described below. The oscillator circuit 54 further comprises a current source 53 and a capacitor 55. The current source provides the sense current 22 that flows through the beams of the MEMS piezoresistive resonator 8 as described earlier above. The capacitor 55 blocks the sense current 22 from entering the RF signal loop of the oscillator circuit.

The pressure sensor arrangement 50 further comprises a digital frequency counter 56 connected in series with the oscillating circuit 54, and a processor 58 connected in series with the output of the digital frequency counter 56. The digital frequency counter 56 determines a value of the frequency at which the oscillator circuit 54 is resonating. The further feedback loop mentioned above is provided between the digital frequency counter 56 and the current source 53 so as to feed a feedback signal 82 to the current source 53. The current source 53 varies its output such that the sense current 22 is varied to keep the resonant frequency of the oscillator circuit 54 constant despite varying pressure. The feedback signal 82 is the output of the digital frequency counter 56. In this embodiment feedback signal 82 is also forwarded to the processor 58. The processor 58 includes an integration circuit for integrating the feedback signal 82 over time to provide an integrated feedback signal. (In other embodiments, a separate integration circuit may be provided between the frequency counter 56 and the processor 58.) The processor 58 is pre-programmed with an integrated feedback signal/pressure characteristic derived from the various response characteristics described above with reference to FIGS. 3 and 4 and the feedback circuits of the pressure sensor arrangement 80. The processor 58 processes the integrated feedback signal 82 in relation to the pre-programmed integrated feedback signal/pressure characteristic to provide an output 59 representing the determined pressure value.

The output 59 may be fed into further apparatus as required or desired according to the circumstances under consideration. For example, the output 59 may be fed into a display to enable the pressure value to be displayed or otherwise indicated. Alternatively, or in addition, the output 59 may be fed into automatic test equipment or a control apparatus in which the sensed pressure reading is used as a test input parameter or as a control input variable respectively.

Another possibility is that some or all of the processing carried out by the processor 58 may be carried out instead by parts of end-use apparatus such as a display and/or a control apparatus.

In the above described embodiment the frequency is counted by the digital frequency counter 56. However, in other embodiments, the frequency may be counted or determined by any other suitable apparatus, for example a phase-lock frequency counter or a heterodyne frequency counter.

The above described embodiments based on the FIG. 8 arrangement may suffer from a dependency on ambient temperature. Thus in further embodiments, a temperature sensor is included, preferably "on-chip" with the MEMS piezoresistive resonator 8, and a circuit is provided to include temperature correction based on the output of the temperature sensor. This circuit may be provided as part of the processor 58, or the digital frequency counter 56, or may be a separate module.

The above described embodiments based on the FIG. 8 arrangement may suffer from variation of resonant frequency of the MEMS piezoresistive resonator 8 from one device to another due to material and/or manufacturing process variations. This can be alleviated by conventional calibration processes.

In further embodiments based on the FIG. 8 arrangement, the pressure sensor arrangement 80 may be adapted to use a reference resonator, in corresponding fashion to the embodiments described above with reference to FIG. 7. In this case, the signal as a result from the mixer, the filter and the frequency counter of FIG. 7 is fed back into the current source to drive the frequency of the MEMS piezoresistive resonator 8 to be the same as the reference resonator.

Figure 9:
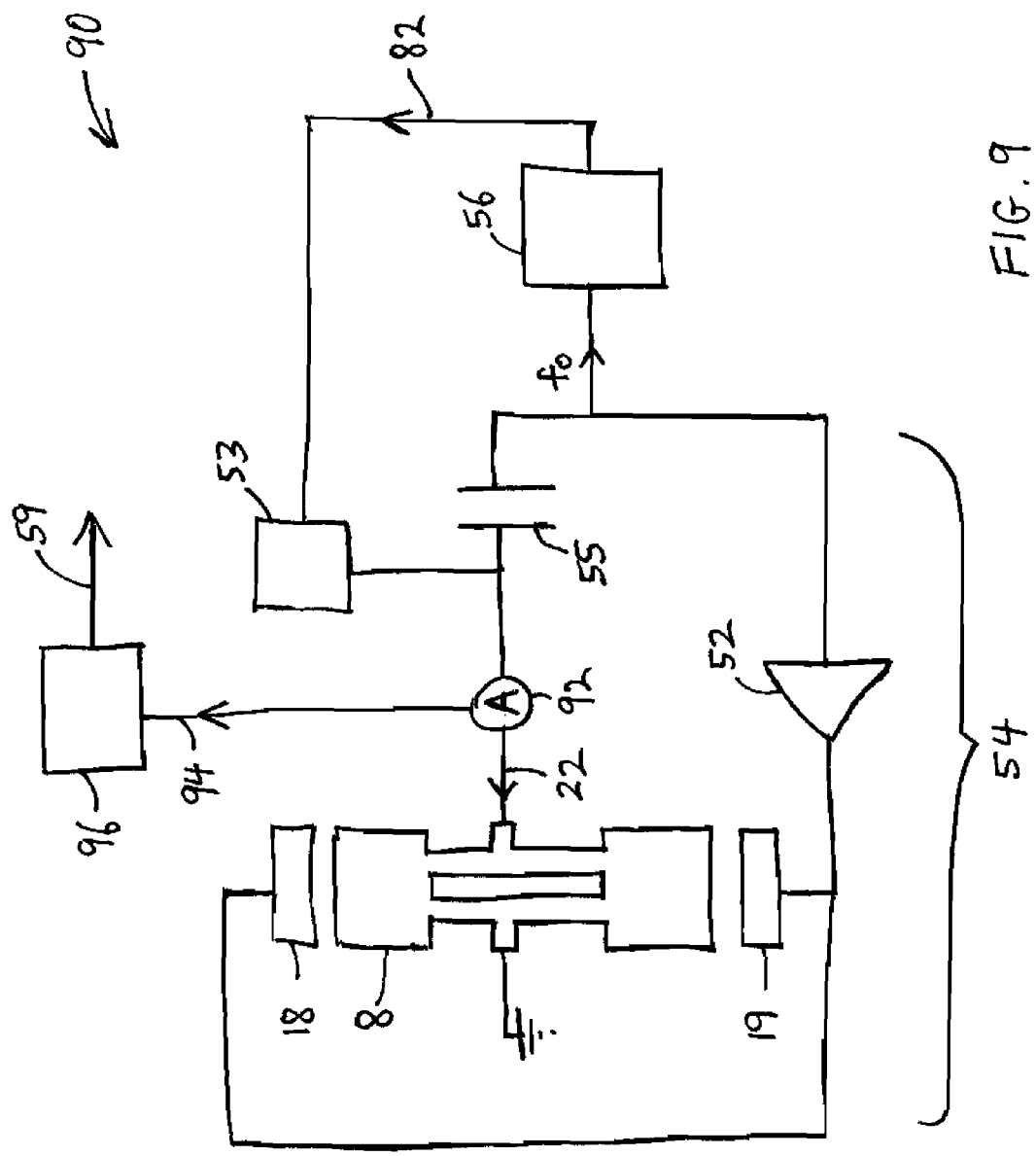
FIG. 9 is a simplified circuit/block diagram showing certain details of a pressure sensor arrangement.

FIG. 9 is a simplified circuit/block diagram showing certain details of a further embodiment of a pressure sensor arrangement 90 using the above described MEMS piezoresistive resonator 8. The pressure sensor arrangement 90 comprises the above described MEMS piezoresistive resonator 8 arranged in a feedback loop with an integrated amplifier 52. The MEMS piezoresistive resonator 8 and the integrated amplifier 52 together provide an oscillator circuit 54 whose oscillating frequency $f_0$ would tend to vary with pressure as described above, but in this embodiment is kept at $f_0$ (or some other fixed value) by a further feedback loop described below. The oscillator circuit 54 further comprises a current source 53, a capacitor 55, and an ammeter 92. The current source provides the current that is controlled by the oscillator circuit 54 to provide the sense current 22 that flows through the beams of the MEMS piezoresistive resonator 8 as described earlier above. The capacitor 55 blocks the sense current 22 from entering the RF signal loop of the oscillator circuit.

The pressure sensor arrangement 90 further comprises a digital frequency counter 56 connected in series with the oscillating circuit 54, and a processor 96 connected with the output of the ammeter 92. The digital frequency counter 56 determines a value of the frequency at which the oscillator circuit 54 is resonating. The further feedback loop mentioned above is provided between the digital frequency counter 56 and the current source 53 so as to feed a feedback signal 82 to the current source 53. The current source 53 varies its output such that the sense current 22 is varied to keep the resonant frequency of the oscillator circuit 54 constant despite varying pressure. The feedback signal 82 is the output of the digital frequency counter 56. In this embodiment the DC component of the sense current 22 is measured by the ammeter 92 and the DC current reading 94 is forwarded to the processor 96. The processor 96 is pre-programmed with a sense current/pressure characteristic derived from the various response characteristics described above with reference to FIGS. 3 and 4 and the feedback circuits of the pressure sensor arrangement 90. The processor 96 processes the DC current reading 94 in relation to the pre-programmed sense current/pressure characteristic to provide an output 59 representing the determined pressure value.

The output 59 may be fed into further apparatus as required or desired according to the circumstances under consideration. For example, the output 59 may be fed into a display to enable the pressure value to be displayed or otherwise indicated. Alternatively, or in addition, the output 59 may be fed into automatic test equipment or a control apparatus in which the sensed pressure reading is used as a test input parameter or as a control input variable respectively.

Another possibility is that some or all of the processing carried out by the processor 96 may be carried out instead by parts of end-use apparatus such as a display and/or a control apparatus.

In the above described embodiment the frequency is counted by the digital frequency counter 56. However, in other embodiments, the frequency may be counted or determined by any other suitable apparatus, for example a phase-lock frequency counter or a heterodyne frequency counter.

The above described embodiments based on the FIG. 9 arrangement may suffer from a dependency on ambient temperature. Thus in further embodiments, a temperature sensor is included, preferably "on-chip" with the MEMS piezoresistive resonator 8, and a circuit is provided to include temperature correction based on the output of the temperature sensor. This circuit may be provided as part of the processor 96, or the digital frequency counter 56, or may be a separate module.

The above described embodiments based on the FIG. 9 arrangement may suffer from variation of resonant frequency of the MEMS piezoresistive resonator 8 from one device to another due to material and/or manufacturing process variations. This can be alleviated by conventional calibration processes.

In further embodiments based on the FIG. 9 arrangement, the pressure sensor arrangement 90 may be adapted to use a reference resonator, in corresponding fashion to the embodiments described above with reference to FIG. 7. In this case, the signal as a result from the mixer, the filter and the frequency counter of FIG. 7 is fed back into the current source to drive the frequency of the MEMS piezoresistive resonator 8 to be the same as the reference resonator.

The pressure sensors of the above described embodiments may all be used as general pressure sensors and/or vacuum gauges in any suitable application or environment.

One particularly advantageous use of the above described pressure sensors is to build such a sensor as part of a MEMS device that comprises a thin film micro-cavity, which micro-cavity is required to have a good quality vacuum within. A pressure sensor according to any of the above embodiments may be fabricated within the micro-cavity as part of the MEMS manufacturing process. The pressure sensor can then provide an in-situ reading as required, for example as part of testing during the manufacturing process of the micro-cavity MEMS, or during operation of the micro-cavity MEMS. Micro-cavity MEMS are well known, see for example U.S.

Pat. No. 7,029,829 and WO 2006/081636, the contents of each of which are incorporated herein by reference.

All the above embodiments use a MEMS piezoresistive resonator as described above with reference to FIG. 2. However, the materials and form of the MEMS piezoresistive resonator may be varied in other embodiments. For example, the MEMS piezoresistive resonator need not be "dog-bone" shaped, in that the heads may be the same width as the overall width taken up by the beams. Furthermore, the beams and anchor may be replaced by alternative structures. Yet further, a MEMS piezoresistive resonator may be used that has less symmetry than the one described above, for example there may be a head and beams on only one side of the anchors. Yet further, MEMS resonators of completely different shape may be used, for example a square plate which can expand and contract in all four sides, or a circle whose the circumference can extend or contract, and so on.

Various specific readout and measurement processing circuits and arrangements are described above in relation to the above described embodiments. However, in other embodiments, any other suitable form of readout and measurement processing circuits and arrangements may be employed. For example, use (or further use) may be made of differentiating techniques, for example determining resonant frequency change rather than resonant frequency values as such. Other possibilities include time-averaging of values, digital-to-analogue conversions, analogue-to-digital conversions, and so on.

In the above described embodiments, only one pressure sensing MEMS piezoresistive resonator is used (with or without a reference resonator) to provide a given pressure sensing arrangement. However, in other embodiments, more than one pressure sensing MEMS piezoresistive resonator is used (with or without a reference resonator) to provide a given pressure sensing arrangement. The readings from such plural pressure sensing MEMS piezoresistive resonators may be combined in any suitable fashion to provide an overall pressure output. For example, the different readings may be averaged. Any such combining of the outputs may be performed on the final pressure indication output, or on any intermediate determination point, such as sensing resonator frequency determination. In those embodiments using a reference resonator, plural reference resonators may therefore also be provided, for example one reference resonator for each sensing MEMS piezoresistive resonator, or one reference resonator for each pair of sensing MEMS piezoresistive resonators, say.

In those above described embodiments using a reference resonator, the reference resonator is positioned alongside the sensing MEMS piezoresistive resonator, and is manufactured to be as identical as possible. However, in other embodiments the reference resonator may be positioned other than alongside the sensing MEMS piezoresistive resonator and/or the reference resonator may be structured differently to the sensing MEMS piezoresistive resonator. In these cases, other advantages such as manufacturing yield may be gained whilst still achieving advantageous degrees of compensation for temperature variation and/or manufacturing variations, albeit potentially with a lesser degree of compensation.

In those above described embodiments using a reference resonator, various specific readout and measurement processing circuits and arrangements are described, for example in FIG. 7. However, in other embodiments, any other suitable form of readout and measurement processing circuits and arrangements may be employed to make use of the compensation behaviour provided by use of a reference resonator.

In those above described embodiments using a reference resonator, only one reference resonator is used (except for certain examples discussed briefly above where there are plural sensing MEMS piezoresistive resonators). However, in other embodiments, plural reference resonators may be used in a given pressure sensor arrangement, even when there is only one sensing MEMS piezoresistive resonator. The reference characteristics of the plural reference resonators may be combined in any suitable fashion. This gives the potential for more accurate compensation. This is particularly advantageous in embodiments where a pair of reference resonators is placed alongside a sensing MEMS piezoresistive resonator, with a first of the pair of reference resonators to one side (in the sense of in the plane of the substrate) of the sensing MEMS piezoresistive resonator and the second of the pair of reference resonators to the other side (in the sense of in the plane of the substrate) of the sensing MEMS piezoresistive resonator, i.e. across the page in terms of, say, FIG. 6. With such an arrangement, there is provided an averaging of compensation for any temperature variation and/or process variation that extends across the sensing MEMS piezoresistive resonator (in the sense of in the plane of the substrate). In corresponding fashion, two reference resonators could additionally or instead be provided above and below (in the sense of in the plane of the substrate) the sensing MEMS piezoresistive resonator, thereby providing an averaging of compensation for any temperature variation and/or process variation that extends from the top to the bottom of the substrate (in the sense of in the plane of the substrate), i.e. from the top to the bottom of the page in terms of, say, FIG. 6.

The above embodiments tend to provide one or more of the following advantages.

The readings tend not to be influenced by 1/f noise, and are less influenced by thermal noise than is the case for conventional pressure sensors.

A complete pressure gauge, or vacuum gauge, can be made by integrating the sense resonator, any reference resonator, and other electronics on a single chip, thereby providing efficient manufacture, potentially low cost, and compact size.

Less power tends to be used than is the case for conventional Pirani gauges, since the sense current can be lower since there tends to be a higher signal to noise ratio.

A pressure gauge can be provided in situ within the microcavity of a MEMS.

The invention claimed is:

1. A method for pressure sensing, the method comprising:
   driving a MEMS piezoresistive resonator into resonant vibration;
   applying Joule heating to the MEMS piezoresistive resonator; and
   sensing a variable parameter that varies in response to the tendency of the resonant frequency of the MEMS piezoresistive resonator to depend upon the temperature of the MEMS piezoresistive resonator, the temperature of the MEMS piezoresistive resonator depending upon the pressure.

2. A method according to claim 1, wherein the variable parameter is the resonant frequency of the MEMS piezoresistive resonator or a change in the resonant frequency of the MEMS piezoresistive resonator.

3. A method according to claim 1, wherein the variable parameter is derived from a feedback loop arranged to provide a varying sense current to the MEMS piezoresistive resonator to keep the resonant frequency constant in opposition to the tendency of the resonant frequency of the MEMS piezoresistive resonator to depend upon the temperature of the MEMS piezoresistive resonator.

4. A method according to claim 3, wherein the variable parameter is a feedback signal in the feedback loop that is integrated over time.

5. A method according to claim 3, wherein the variable parameter is a component of the sense current being varied to keep the resonant frequency constant in opposition to the tendency of the resonant frequency of the MEMS piezoresistive resonator to depend upon the temperature of the MEMS piezoresistive resonator, the temperature of the MEMS piezoresistive resonator depending upon the pressure.

6. A method according to claim 1, wherein the pressure sensed is that of a vacuum.

7. A method according to claim 1, wherein the pressure sensed is that inside a micro-cavity of a MEMS, and the MEMS piezoresistive resonator is integrated in the micro-cavity.

8. A method for pressure sensing, the method comprising:
driving a MEMS piezoresistive resonator into resonant vibration;
applying Joule heating to the MEMS piezoresistive resonator; and
sensing a variable parameter that varies in response to the tendency of the resonant frequency of the MEMS piezoresistive resonator to depend upon the temperature of the MEMS piezoresistive resonator, the temperature of the MEMS piezoresistive resonator depending upon the pressure, and the variable parameter being derived from a feedback loop arranged to provide a varying sense current to the MEMS piezoresistive resonator to keep the resonant frequency constant in opposition to the tendency of the resonant frequency of the MEMS piezoresistive resonator to depend upon the temperature of the MEMS piezoresistive resonator;
driving a reference MEMS capacitive resonator in the vicinity of the MEMS piezoresistive resonator; and
compensating the sensed variable parameter with an output of the reference MEMS capacitive resonator.

9. A method according to claim 8 wherein the sense current is being varied to keep the resonant frequency of the MEMS piezoresistive resonator the same as the resonant frequency of the reference MEMS capacitive resonator.

10. A method according to claim 8, wherein the reference MEMS capacitive resonator is positioned adjacent to the MEMS piezoresistive resonator.

11. A method according to claim 8, wherein the reference MEMS capacitive resonator is structurally the same as the MEMS piezoresistive resonator.

12. A method according to claim 8, wherein the reference MEMS capacitive resonator is integrated on a same substrate as the MEMS piezoresistive resonator.

13. A pressure sensor, comprising:
a MEMS piezoresistive resonator; and
means for determining a variable parameter that varies in response to the tendency of the resonant frequency of the MEMS piezoresistive resonator to depend upon the temperature of the MEMS piezoresistive resonator, the temperature of the MEMS piezoresistive resonator depending upon the pressure.

14. A pressure sensor according to claim 13, wherein the means for determining the variable parameter comprises a frequency counter for measuring the resonant frequency of the MEMS piezoresistive resonator or a change in the resonant frequency of the MEMS piezoresistive resonator.

15. A pressure sensor according to claim 13, wherein the means for determining the variable parameter comprises a feedback loop arranged to provide a varying sense current to the MEMS piezoresistive resonator to keep the resonant frequency constant in opposition to the tendency of the resonant frequency of the MEMS piezoresistive resonator to depend upon the temperature of the MEMS piezoresistive resonator.

16. A pressure sensor according to claim 15, wherein the variable parameter is a feedback signal in the feedback loop that is integrated over time.

17. A pressure sensor according to claim 15, wherein the variable parameter is a component of the sense current being varied to keep the resonant frequency constant in opposition to the tendency of the resonant frequency of the MEMS piezoresistive resonator to depend upon the temperature of the MEMS piezoresistive resonator, the temperature of the MEMS piezoresistive resonator depending upon the pressure.

18. A vacuum sensor comprising a pressure sensor according to claim 13.

19. A MEMS, comprising:
a micro-cavity; and
a pressure or vacuum sensor according to claim 13;
wherein the MEMS piezoresistive resonator of the pressure or vacuum sensor is integrated in the micro-cavity.

20. A pressure sensor, comprising:
a MEMS piezoresistive resonator; and
means for determining a variable parameter that varies in response to the tendency of the resonant frequency of the MEMS piezoresistive resonator to depend upon the temperature of the MEMS piezoresistive resonator, the temperature of the MEMS piezoresistive resonator depending upon the pressure;
a feedback loop arranged to provide a varying sense current to the MEMS piezoresistive resonator to keep the resonant frequency constant in opposition to the tendency of the resonant frequency of the MEMS piezoresistive resonator to depend upon the temperature of the MEMS piezoresistive resonator; and
a reference MEMS capacitive resonator located in the vicinity of the MEMS piezoresistive resonator and arranged to compensate the sensed variable parameter with an output of the reference MEMS capacitive resonator.

21. A pressure sensor according to claim 20 wherein the sense current is being varied to keep the resonant frequency of the MEMS piezoresistive resonator the same as the resonant frequency of the reference MEMS capacitive resonator.

22. A pressure sensor according to claim 20, wherein the reference MEMS capacitive resonator is positioned adjacent to the MEMS piezoresistive resonator.

23. A pressure sensor according to claim 20, wherein the reference MEMS capacitive resonator is structurally the same as the MEMS piezoresistive resonator.

24. A pressure sensor according to claim 20, wherein the reference MEMS capacitive resonator is integrated on a same substrate as the MEMS piezoresistive resonator.

* * * * *